(12) United States Patent
Lee et al.

(10) Patent No.: US 8,797,780 B2
(45) Date of Patent: Aug. 5, 2014

(54) MEMORY DEVICE HAVING SUB-BIT LINES AND MEMORY SYSTEM

(71) Applicant: Samsung Electronics Co., Ltd., Suwon-si (KR)

(72) Inventors: Doo Sub Lee, Yongin-si (KR); Pan Suk Kwak, Seoul (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 0 days.

(21) Appl. No.: 13/783,877

(22) Filed: Mar. 4, 2013

(65) Prior Publication Data

US 2013/0176782 A1 Jul. 11, 2013

Related U.S. Application Data

(63) Continuation of application No. 12/652,218, filed on Jan. 5, 2010, now Pat. No. 8,391,042.

(30) Foreign Application Priority Data

Jan. 6, 2009 (KR) ........................ 10-2009-0000630

(51) Int. Cl.
*G11C 5/06* (2006.01)

(52) U.S. Cl.
CPC ..................................... *G11C 5/063* (2013.01)
USPC ................... 365/63; 365/230.03; 365/185.11; 365/185.12; 365/185.13; 365/210.13

(58) Field of Classification Search
CPC ...... G11C 11/5628; G11C 7/18; G11C 16/24; G11C 16/0475; G11C 16/16; G11C 7/12; G11C 8/00; H01L 27/115
USPC ............. 365/230.03, 185.11, 185.12, 185.13, 365/63, 210.13
See application file for complete search history.

(56) References Cited

U.S. PATENT DOCUMENTS

| 6,845,042 B2 | 1/2005 | Ichige et al. |
| 2005/0248984 A1* | 11/2005 | Ogura et al. ............. 365/185.18 |
| 2007/0026672 A1 | 2/2007 | Tang et al. |
| 2009/0116285 A1* | 5/2009 | Youn ........................ 365/185.11 |

FOREIGN PATENT DOCUMENTS

| KR | 100719694 B1 | 5/2007 |
| KR | 1020080004285 A | 1/2008 |

* cited by examiner

*Primary Examiner* — Thong Q Le
(74) *Attorney, Agent, or Firm* — Volentine & Whitt, PLLC (57) ABSTRACT

A memory device includes; a memory cell array including a memory cell connected to a bit line, a page buffer unit receiving data from the memory cell via the bit line, and a contact unit providing an electrical path through which the data is communicated from the memory cell array to the page buffer unit, wherein the contact unit comprises a sub-bit line configured to connect the bit line via a first contact with the page buffer unit via a second contact.

18 Claims, 9 Drawing Sheets

MEMORY DEVICE HAVING SUB-BIT LINES AND MEMORY SYSTEM

CROSS-REFERENCE TO RELATED APPLICATIONS

This application is a Continuation of application Ser. No. 12/652,218, filed Jan. 5, 2010, which claims priority under 35 U.S.C. §119 to Korean Patent Application No. 10-2009-0000630 filed on Jan. 6, 2009, the subject matter of which is hereby incorporated by reference.

BACKGROUND

Embodiments of the present inventive concept relate to semiconductor devices, and more particularly to NAND flash memory devices and memory systems including same.

NAND flash memory devices typically include a cell region and a peripheral circuit region. The cell region of a NAND flash memory device includes a memory cell array arranged in a number of blocks. In contrast, the peripheral circuit region includes a plurality of page buffer units arranged to form a page buffer. A plurality of bit lines within the NAND flash memory device extend from the cell region to the peripheral circuit region, and respectively connect some portion of the memory cell array with one or more the plurality of page buffer units.

In a conventional NAND flash memory, the separating "pitch" between adjacent ones of the plurality of bit lines, (i.e., the spacing interval between two neighboring bit lines) is very narrow. Accordingly, various electrical contacts (such as those connecting page buffer units) formed in relation to each one of the plurality of bit lines must be very carefully laid-out and fabricated. Misaligned, poorly laid-out, and/or oversized contacts may extend across neighboring bits lines and cause circuit malfunctions. Unfortunately, the narrower the separation pitch between the plurality of bit lines, the more likely this type of contact structure formation failure becomes in contemporary NAND flash memory devices. Accordingly, the design and fabrication of contacts in relation to the plurality of bits lines in NAND flash memory devices remains area of careful consideration, and this is particularly true in relation to the contact area(s) between the plurality of bit lines and the plurality of page buffer units.

SUMMARY

Embodiments of the inventive concept provide a memory device capable of securing an adequate contact area. Embodiments of the inventive concept also provide memory system incorporating such memory devices.

In one embodiment, the inventive concept provides a memory device comprising; a memory cell array comprising a memory cell connected to a bit line, a page buffer unit receiving data from the memory cell via the bit line, and a contact unit providing an electrical path through which the data is communicated from the memory cell array to the page buffer unit, wherein the contact unit comprises a sub-bit line configured to connect the bit line via a first contact with the page buffer unit via a second contact.

In another embodiment, the inventive concept provides a memory device comprising; a semiconductor substrate, a memory cell array disposed in a cell region of the semiconductor substrate, wherein a plurality of bit lines is respectively connected to portions of the memory cell array, a page buffer unit disposed in a peripheral circuit region of the semiconductor substrate adjacent to the cell region, and a contact unit disposed between the memory cell array and the page buffer unit, and comprising a sub-bit line connecting one of the plurality of bit lines to a corresponding page buffer in the page buffer unit, wherein the sub-bit line is formed at a different level above the semiconductor substrate than the bit line.

In yet another embodiment, the inventive concept provides a memory system comprising; a card interface, a slot configured to receive the card interface, and a memory device configured to be connected via the slot, wherein the memory device comprises; a memory cell array disposed in a cell region of a semiconductor substrate, wherein a plurality of bit lines is respectively connected to portions of the memory cell array, a page buffer unit disposed in a peripheral circuit region of the semiconductor substrate adjacent to the cell region, and a contact unit disposed between the memory cell array and the page buffer unit, and comprising a sub-bit line connecting one of the plurality of bit lines to a corresponding page buffer in the page buffer unit, wherein the sub-bit line is formed at a different level above the semiconductor substrate than the bit line.

DETAILED DESCRIPTION OF THE EMBODIMENTS

Reference will now be made in some additional detail to various embodiments of the inventive concept, examples of which are illustrated in the accompanying drawings. Throughout the written description and drawings, like reference numbers and labels are used to indicate like or similar elements.

Figure 1:
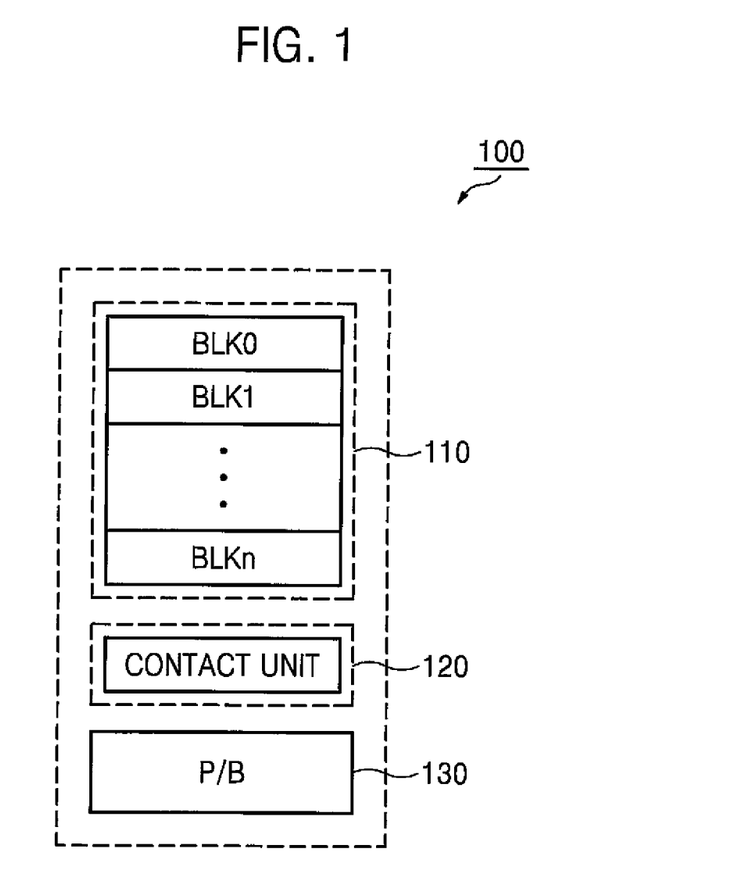
FIG. 1 is a block diagram of a memory device according to an embodiment of the inventive concept.
Figure 2:
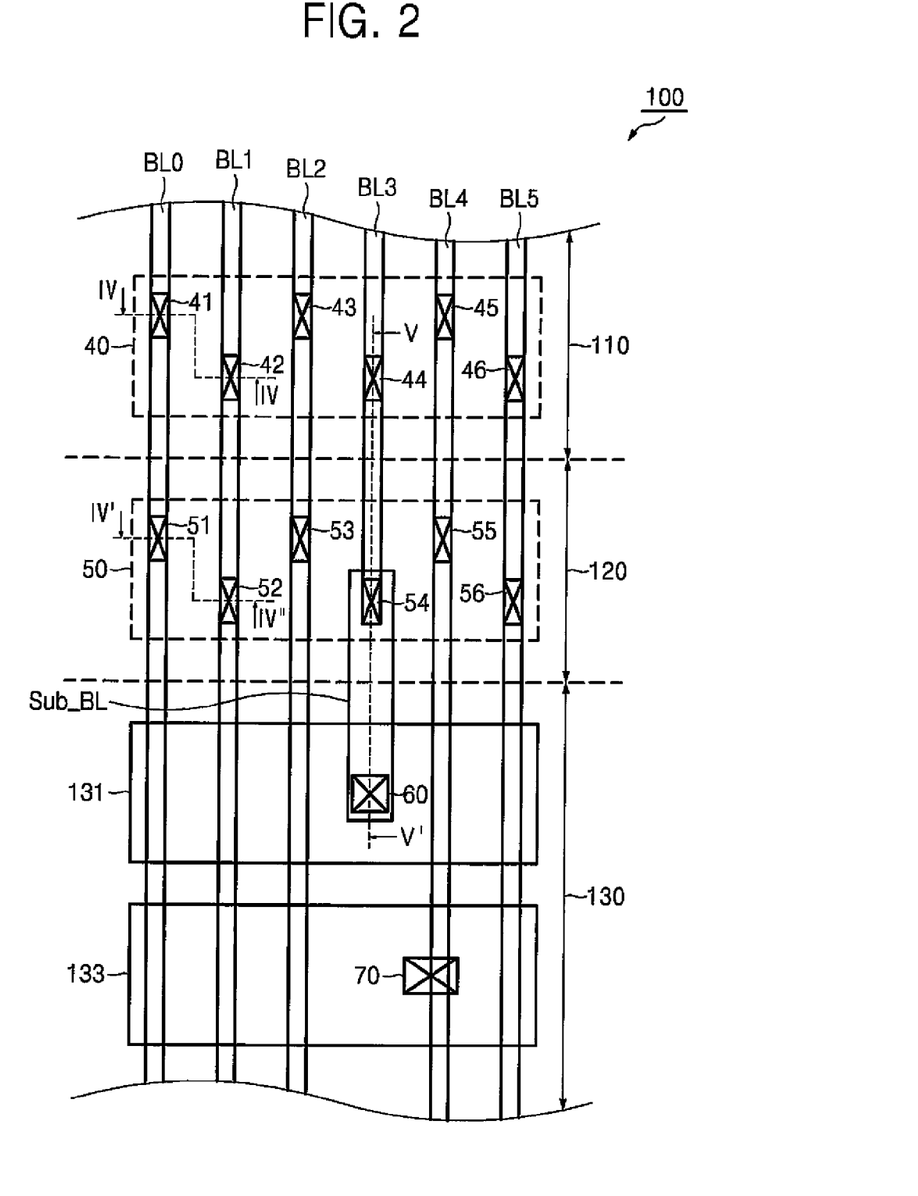
FIG. 2 is a schematic layout diagram of the memory device illustrated in FIG. 1.
Figure 3:
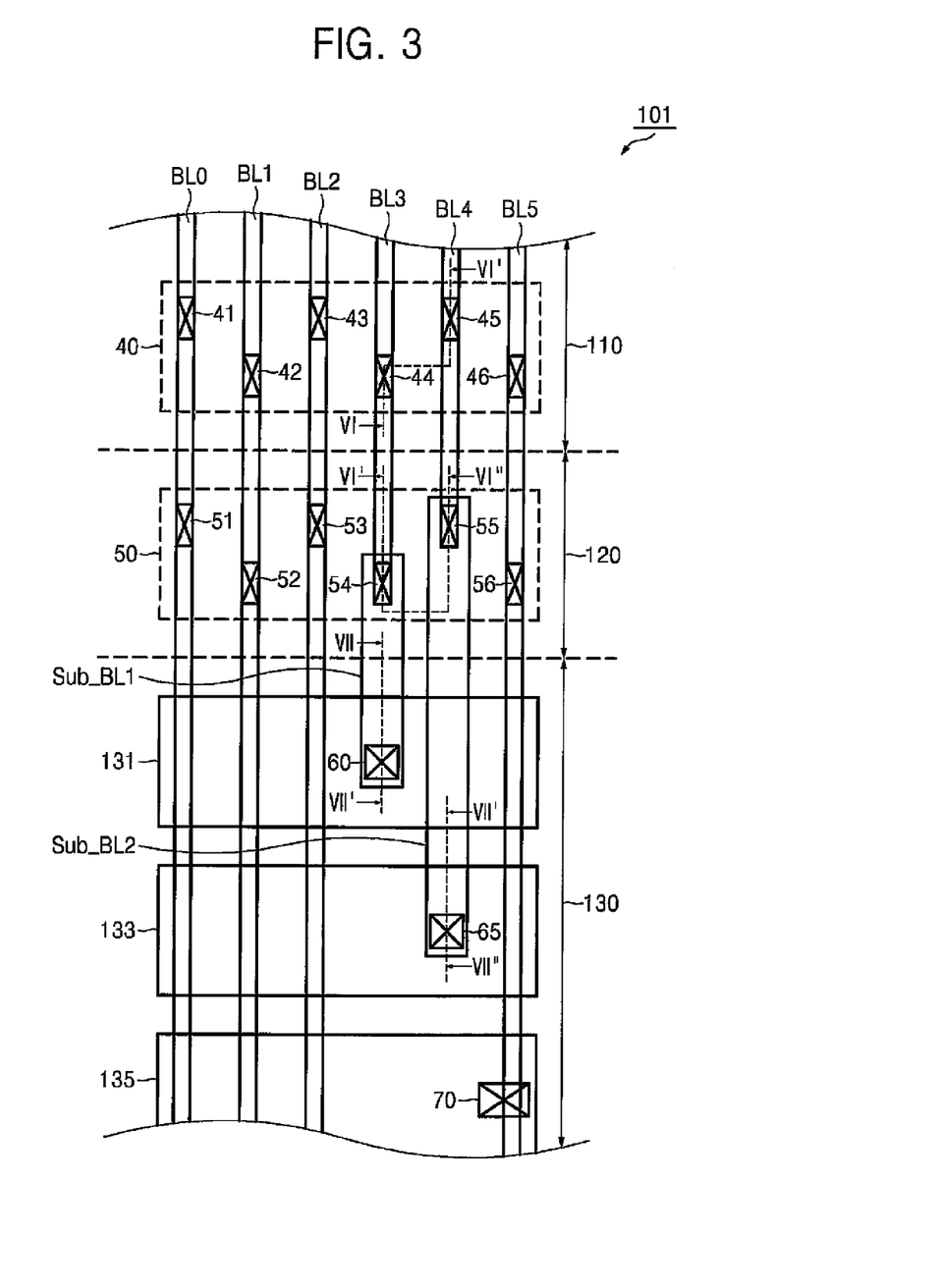
FIG. 3 is a schematic layout diagram of the memory device according to another embodiment of the inventive concept.

Figure (FIG.) 1 is a block diagram of a memory device according to an embodiment of the inventive concept. FIG. 2 is a schematic layout diagram of the memory device illustrated in FIG. 1. FIG. 3 is a schematic layout diagram of the memory device according to another embodiment of the inventive concept.

Referring to FIGS. 1 through 3, memory devices 100 and 101 comprise a memory cell array 110 divided into a plurality of cell blocks BLK0 to BLKn, a contact unit 120, and a page buffer unit 130. The memory cell array 110 comprises a plurality of memory cells (not shown) variously connected to a plurality of bit lines. In the illustrated embodiments, only bit lines BL0 through BL5 are shown, but those skilled in the art will recognize that any reasonable number of bits lines may be present.

The plurality of bit lines BL0 to BL5 is illustrated as extending in a columnar direction within the drawings. Each one of the plurality of bit lines BL0 to BL5 is connected within the memory cell array 110, and may also be connected within the contact unit 120 and/or the page buffer unit 130.

For example, within the memory cell region 110 of the memory devices 100 and 101, a first contact array 40 is provided to connect a plurality of first contacts (e.g., first contacts 41 through 46) to the plurality of bit lines BL0 to BL5. That is, the plurality of first contacts 41 to 46 in the first contact array 40 are respectively formed between one of the plurality of bit lines BL0 to BL5 and some portion of the memory cell array 110 (e.g., a string of NAND memory cells). In the illustrated embodiment, the plurality of first contacts 41 to 46 is arranged in a zigzag pattern across adjacent ones of the plurality of bit lines BL0 to BL5 in the memory cell region 110 of the memory devices 100 and 101.

The page buffer unit 130 includes a plurality of page buffer units (e.g., the plurality of page buffer units 131, 133, 135) variously arranged within the peripheral circuit region of memory devices 100 and 101. Each one of the plurality of page buffer units 131, 133, 135 may be connected to a corresponding portion of the memory cell array via one or more of the plurality of bit lines BL0 to BL5 using at least one sub-bit line (Sub_BL) extending from the contact unit 120 into the page buffer unit 130.

Referring for example to FIG. 2, the page buffer unit 130 includes a first page buffer unit 131 and a second page buffer 133. The first page buffer unit 131 is connected to a first portion of the memory cell array 110 at contact 44 via a fourth bit line BL3. This electrical connection between the memory cell array 110 and the page buffer unit 130 is made by means of a first sub-bit line Sub_BL connected to the fourth bit line BL3 at contact 54 and the first page buffer unit 131 at contact 60.

In contrast, the second page buffer unit 133 is directly connected to (absent a sub-bit line) a fifth bit line BL4. Thus the fifth bit line BL4 extends from the memory cell array 110 to the second page buffer unit 133 through the contact unit 120.

By way of comparison and referring to FIG. 3, another embodiment of the inventive concept comprises in addition to the first page buffer unit 131 and second page buffer unit 133, a third page buffer unit 135. Here, the second page buffer unit 133 is connected to the second portion of the memory cell array 110 via the fifth bit line BL4 and a second sub-bit line Sub-BL2. The third page buffer unit 135 is directly connected to a third portion of the memory cell array 110 via the fifth bit line BL5.

Thus, referring to FIGS. 1 through 3, the contact unit 120 may be used as a sub-bit line interface region between various portions of the memory cell array 110 and the page buffer unit 130 within memory devices 100 and 101. Accordingly, the contact unit 120 comprises a second contact array 50 including a plurality of second contacts (e.g., second contacts 51 to 56). The second contact array 50 may have the same structure as the first contact array 40. The plurality of second contacts 51 to 56 arranged in the second contact array 50 may be variously connected to one or more of the plurality of bit lines BL0 to BL5. In addition, one or more sub-bit lines may be connected within the second contact array via one or more of the plurality of second contacts 51 to 56.

For example, referring to FIG. 2, the sub-bit line (Sub-BL) extending into the second contact unit 50 is connected to the fourth bit line BL3 via second contact 54, and is also connected within the first page buffer unit 131 via a third contact 60. Thus, the sub-bit line Sub-BL extends into the second contact unit 50 and enables an electrical connection between the first page buffer unit 131 and the memory cell array 110. It should be noted in this regard that the second contact 54 may have a very different size and fabrication configuration than the third contact 60. Similarly, each sub-bit line may have very different physical dimensions (e.g., width and/or thickness, etc.) than a corresponding bit line.

For example, in the illustrated examples of FIGS. 2 and 3, each sub-bit line (Sub-BL) extending from the page buffer unit 130 into the contact unit 120 has at least a greater width than a corresponding bit line (e.g., BL3 and/or BL4). In certain embodiments of the inventive concept, a sub-bit line may be formed over a corresponding bit line in the contact unit 120, and thereafter be electrically connected to the underlying bit line through one or more intervening layers via a second contact. The opposite fabrication relationship between an overlaying bit line (or bitline portion) and a corresponding sub-bit line is also contemplated within embodiment of the inventive concept.

Additionally, although not illustrated in FIGS. 1 through 3, the memory devices 100 and 101 may also include a decoder, (e.g., a row decoder) connected to the memory cell array 110.

Figure 4:
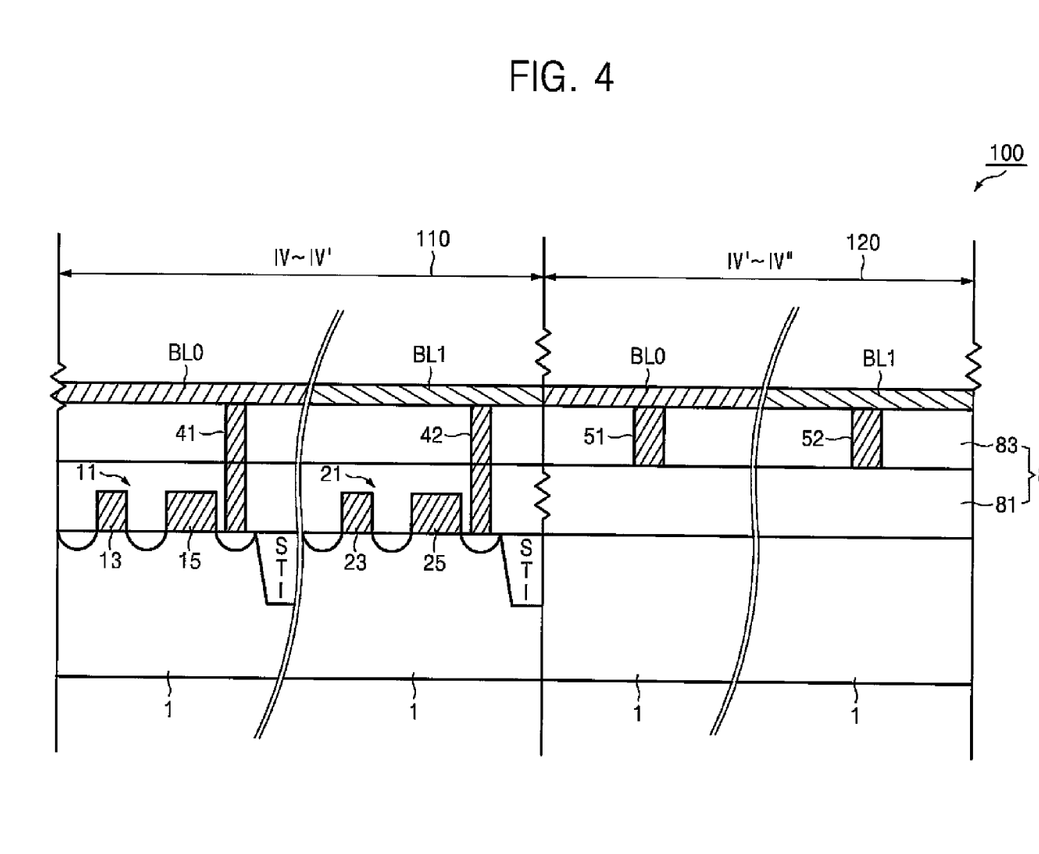
FIG. 4 is a cross-sectional diagram of the memory device illustrated in FIG. 2 taken along the lines IV~IV' and IV'~IV"
Figure 5:
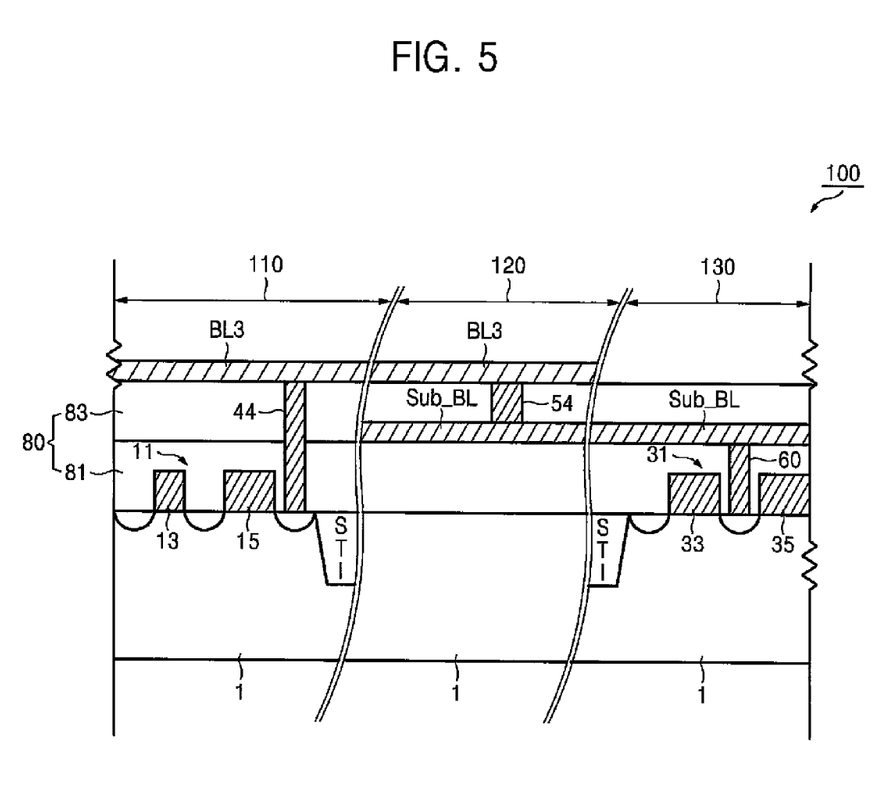
FIG. 5 is a cross-sectional diagram of the memory device illustrated in FIG. 2 taken along lines V~V' and V'~V"

FIG. 4 is a cross-sectional diagram of the memory device illustrated in FIG. 2 taken along lines IV~IV' and IV'~IV". FIG. 5 is a cross-sectional diagram of the memory device illustrated in FIG. 2 taken along lines V~V' and V'~V". Referring to FIGS. 2 and 4, the memory device 100 comprises a first memory cell array portion 11 and a second memory cell array portion 21 as part of the memory cell region 110 formed on a semiconductor substrate 1. A contact (interface) unit 120 is also formed on the semiconductor substrate 1 adjacent to the memory cell array 110.

The semiconductor substrate 1 may be formed from one or more semiconductor materials including, as examples, Si, Ge, SiGe, GaP, GaAs, SiC, SiGeC, InAs, and InP. A SOI substrate may also be used.

The first memory cell array portion 11 comprises first gate structures 13 and 23 and the second memory cell array portion 21 comprises second gate structures 15 and 25.

The first gate structure 13 and 23 may be, for example, a memory cell of the first memory cell array 11 and the second memory cell array 21, i.e., a memory transistor, and the second gate structure 15 and 25 may respectively correspond to, for example, a string selection transistor or a ground selection transistor of the first memory cell array portion 11 and the second memory cell array portion 21. The first gate structure 13 and 23 and the second gate structure 15 and 25 may be formed through a photo-etching process, for example.

At least one insulating film structure 80 is formed over the first memory cell array portion 11 and the second memory cell array portion 21 on the semiconductor substrate 1. For example, a first interlayer insulating film 81 may be formed on the first memory cell array portion 11 and the second memory cell array portion 21 of memory cell region 110, as well as being formed over the contact region 120. Then, a second interlayer insulating film 83 may be formed on the first interlayer insulating film 81. In one embodiment of the inventive concept, the first interlayer insulating film 81 and the second interlayer insulating film 83 may be formed from the same material, such as an oxide film or a nitride film.

The plurality of bit lines (e.g., BL0 though BL5 with BL0 and BL1 being shown in FIG. 4) may then be formed on the second interlayer insulating film 83. In the illustrated embodiment of FIG. 4, the first bit line BL0 is formed in correspondence with the first memory cell array portion 11, and the second bit line BL1 is formed in correspondence with the second memory cell array portion 21.

The first contact array 40 may be disposed through at least a portion of the insulating film structure 80 in the memory cell array 110 of the semiconductor substrate 1. First contacts 41 and 42 are illustrated as examples in FIG. 4. That is, first contact 41 is formed between the first memory cell array portion 11 and the first bit line BL0, and a second gate structure 15 of the first memory cell array portion 11 (i.e., a selection transistor) may thus be connected to the first bit line BL0 via first contact 41. Accordingly, the first memory cell array portion 11 is capable of receiving various control signals (e.g., an address signal) from an external source via the first bit line BL0.

Another first contact 42 is formed between the second memory cell array portion 21 and the second bit line BL1, and the second gate structure 25 of the second memory cell array portion 21 (i.e., a selection transistor) is connected to the second bit line BL1 via the first contact 42. Accordingly, the second memory cell array portion 21 is capable of receiving an externally provided address signal via the second bit line BL1.

The second contact array 50 may be similarly formed in relation to each one of the plurality of bit lines in contact region 120 of the semiconductor substrate 1. As before, the second contact array 50 include a plurality of second contacts 51 to 56. For example, second contact 51 is formed between the first interlayer insulating film 81 and the first bit line BL0 in the contact region 120 of the semiconductor substrate 1, and second contact 52 is formed between the first interlayer insulating film 81 and the second bit line BL1.

The contacts of the second contact array 50 may be formed with the structure as the first contacts in the first contact array 40, albeit at different locations along the length of the bits lines. In one articulation, the first contacts 41 to 46 are formed in upper regions of the bit lines and second contacts 51 to 56 are formed in lower regions of the bit lines.

Thus, as the first bit line BL0 extends in the columnar direction over the semiconductor substrate 1, it may be connected to the first memory cell array portion 11 via first contact 41 disposed in the memory cell array 110, and also be connected via second contact 51 in the contact (interface) region 120.

Alternately, referring to FIGS. 2 and 5, the memory device 100 may again comprise the memory cell array portion 11 formed in the memory cell region 110, the contact unit 120 formed adjacent to the memory cell array 110, and the page buffer unit 130 including a first page buffer unit 131. The memory cell array portion 11 of memory cell region 110 is assumed to have the same structure as previously described with reference to FIG. 4.

However, in the memory cell array portion 11 of FIG. 5, the fourth bitline BL3 is connected to via first contact 44. Further the contact unit 120 formed adjacent to the memory cell array 110 and serving as an interface region comprises one or more sub-bit line(s) Sub-BL. As noted above, the sub-bit line Sub_BL may be used to connect the fourth bit line BL3 extending across the memory cell array 110 and contact unit 120 to a page buffer in the page buffer unit 130.

In the illustrated example of FIG. 5, the sub-bit line Sub-BL is connected to the fourth bit line BL3 via second contact 54, wherein the sub-bit line Sub-BL is first formed on an upper surface of first interlayer insulating layer 81, the second interlayer insulating layer 83 is formed on the sub-bit line Sub-BL, then the second contact 54 is formed through the second interlayer insulating layer 83, so when the fourth bit line BL3 is formed on the upper surface of the second interlayer insulating layer, said fourth bit line BL3 will be electrically connected via second contact 54 to the sub-bit line Sub-BL. Thus, the fourth bit line BL3 is said to be formed "over" the sub-bit line Sub-BL in contact unit 120.

A first page buffer unit 131 is formed in the page buffer region 130 of the semiconductor substrate 1 and comprises at least a gate structure, e.g., a third gate structure 33 and 35. The third gate structure 33 and 35 may be at least one electric circuit connected to a memory cell array 11, for example. The third gate structure 33 and 35 of the first page buffer unit 131 may be the same as a second gate structure 15 and 25 of the first memory cell array 11 and the second memory cell array 21 illustrated above in FIG. 4.

The first page buffer unit 131 is also connected to the sub-bit line Sub-BL via third contact 60 through first interlayer insulating layer 81 in the page buffer region 130 of the semiconductor substrate 1.

Figure 6:
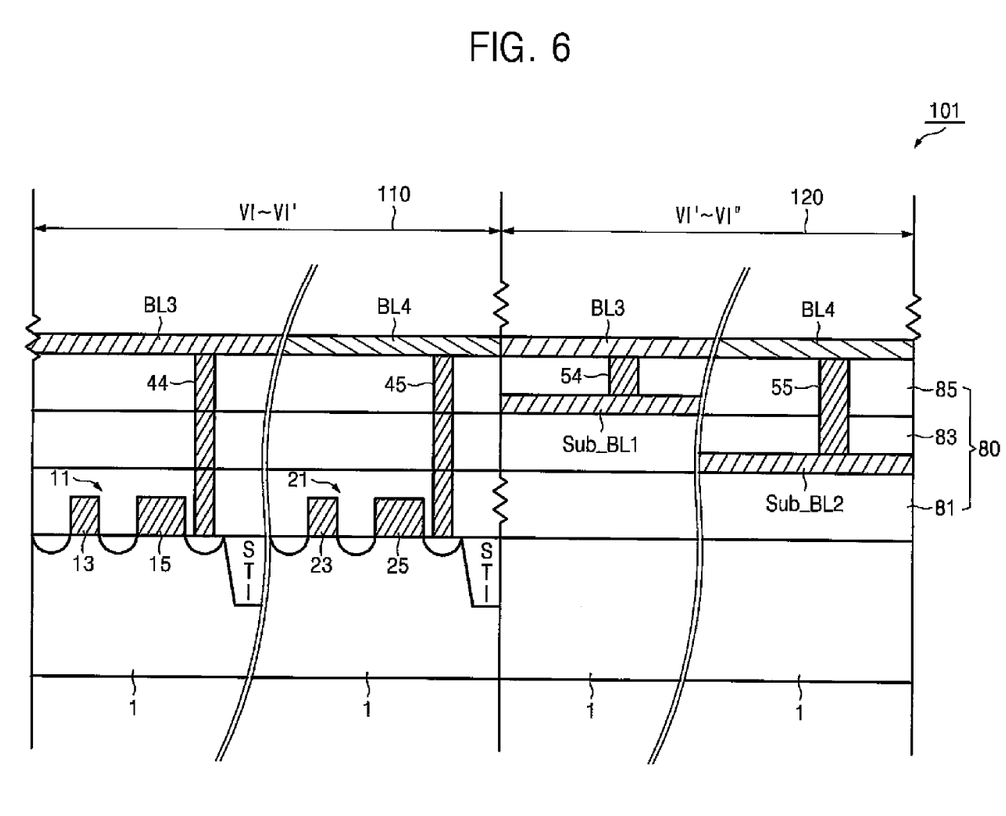
FIG. 6 is a cross-sectional diagram of the memory device illustrated in FIG. 3 taken along lines VI~VI' and VI'~VI"
Figure 7:
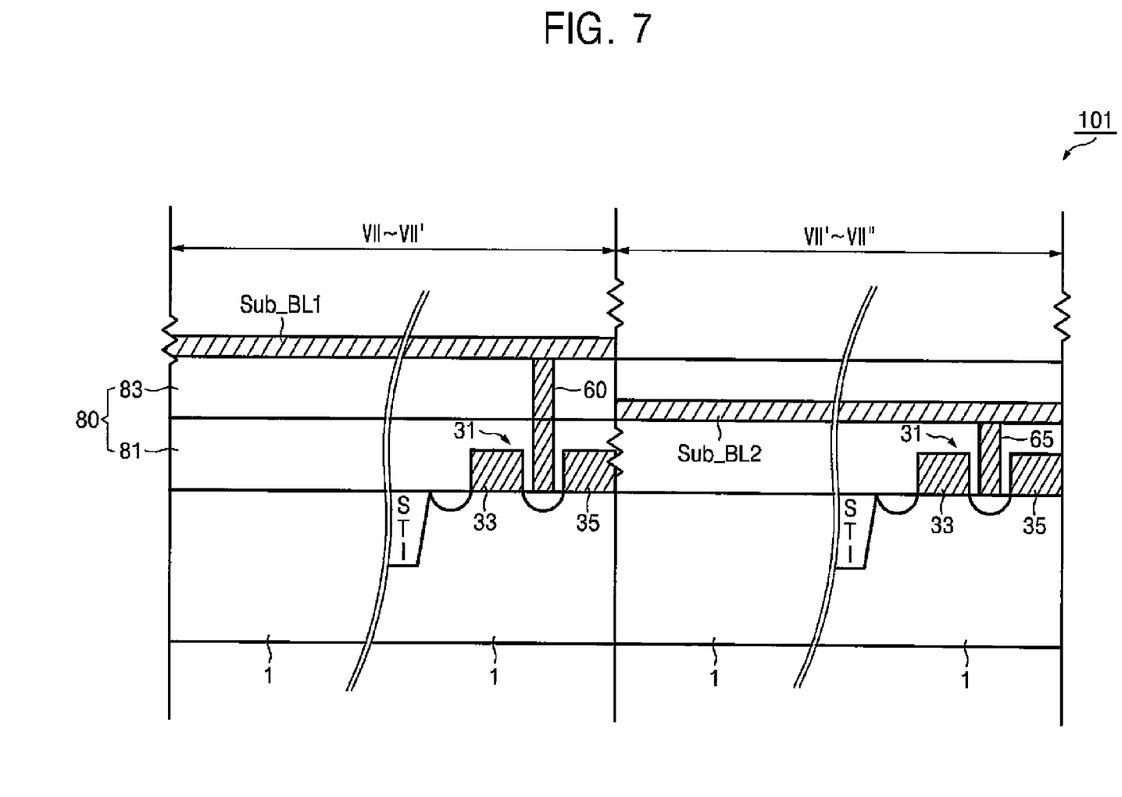
FIG. 7 is a cross-sectional diagram of the memory device illustrated in FIG. 3 taken along lines VII~VII' and VII'~VII"

FIG. 6 is a cross-sectional diagram of the memory device illustrated in FIG. 3 taken along lines VI~VI' and VI'~VI". FIG. 7 is a cross-sectional diagram of the memory device illustrated in FIG. 3 taken along lines VII~VII' and VII'~VII". Referring to FIGS. 3 and 6, the memory device 101 comprises the first memory cell array portion 11 and the second memory cell array portion 21 formed in the memory cell array 110 of the semiconductor substrate 1, and the contact unit 120 formed adjacent to the memory cell unit 110.

The first memory cell array portion 11 and the second memory cell array portion 21 of the present embodiment have substantially the same structure as the first memory cell array portion 11 and the second memory cell array portion 21 explained in relation to FIG. 4 except the following. Here again, the first memory cell array portion 11 is connected to the fourth bit line BL3 via first contact 44, and the second memory cell array portion 21 is connected to the fifth bit line BL4 via first contact 45.

In the contact region 120 of the semiconductor substrate 1, two (2) sub-bit lines, (a first sub-bit line Sub-BL1 and a second sub-bit line Sub-BL2) extend into the contact unit 120. The first sub-bit line Sub-BL1 may be connected to the fourth bit line BL3 via second contact 54, and the second sub-bit line Sub-BL2 is connected to the fifth bit line BL4 via second contact 55. As shown in the illustrated embodiment, the first sub-bit line Sub-BL1 and the second sub-bit line Sub-BL2 may be formed at different levels within the semiconductor substrate 1. For example, the first sub-bit line Sub-BL1 may be formed on the second interlayer insulating film 83, and the second sub-bit line Sub-BL2 may be formed on the first interlayer insulating film 81.

Additionally as illustrated in FIG. 6, the interlayer insulating layer 80 may further comprise a third interlayer insulating film 85 covering the second interlayer insulating film 83 and overlaying the first sub-bit line Sub-BL1.

As shown in FIGS. 3, 6 and 7, the first sub-bit line Sub-BL1 may be connected to a fourth bit line BL3 through a second contact 54 in an contact region 120 of a semiconductor substrate 1. The first sub-bit line Sub-BL1 may be extended from the contact region 120 to a page buffer region 130 of the semiconductor substrate 1, and connected to a first page buffer 131 through a third contact 60. In addition, a second sub-bit line Sub-BL2 may be connected to a fifth bit line BL4 through another second contact 55 in the contact region 120 of the semiconductor substrate 1. The second sub-bit line Sub-BL2 may be extended from the contact region 120 to the page buffer region 130 of the semiconductor substrate 1, and connected to a second page buffer unit 133 through another third contact 65.

Here, the first sub-bit line Sub-BL1 and the second sub-bit line Sub-BL2 may be formed in each different layer on the semiconductor substrate 1. For example, the first sub-bit line Sub-BL1 and the second sub-bit line Sub-BL2 may be formed in each different layer, placing an interlayer insulating film formed on the semiconductor substrate 1, e.g., a second interlayer insulating film 83, in between. The first sub-bit line Sub-BL1 and a second sub-bit line Sub-BL2 may also be formed at each lower part of the fourth bit line BL3 and the fifth bit line BL4.

That is, a first page buffer unit 131 may be connected to a first sub-bit line Sub-BL1 through a third contact 60 in a page buffer region 130 of a semiconductor substrate 1, and the first sub-bit line Sub-BL1 may be connected to a fourth bit line BL3 through a second contact 54 in an contact region 120 of the semiconductor substrate 1. Accordingly, the first page buffer unit 131 may be connected to the fourth bit line BL3 and it may be connected to a first memory cell array 11 connected to the fourth bit line BL3 in a cell region 110 of the semiconductor substrate 1.

Moreover, a second page buffer unit 133 may be connected to a second sub-bit line Sub-BL2 through another third contact 65 in the page buffer region 130 of the semiconductor substrate 1, and the second sub-bit line Sub-BL2 may be connected to a fifth bit line BL4 through another second contact 55 in the contact region 120 of the semiconductor substrate 1. Accordingly, the second page buffer unit 133 may be connected to the fifth bit line BL4 and it may be connected to a second memory cell array 21 connected to the fifth bit line BL4 in the cell region 110 of the semiconductor substrate 1.

Accordingly, a next page buffer unit illustrated in FIG. 3, i.e., a third page buffer unit 135, may secure a contact area where it can be connected to a fifth bit line BL5 through a fourth contact 70 in the page buffer region 130 of the semiconductor substrate 1.

The memory device according to embodiments is described above. The memory device of the embodiments may be, for example, a flash memory device, and may be formed using various types of packages. For example, a flash memory device according to the embodiments may be formed or embodied by using various packages such as a Package on Package (PoP), Ball grid arrays (BGAs), Chip scale packages (CSPs), a Plastic Leaded Chip Carrier (PLCC), a Plastic Dual In-Line Package (PDIP), a Die in Waffle Pack, a Die in Wafer Form, a Chip On Board (COB), a Ceramic Dual In-Line Package (CERDIP), a Plastic Metric Quad Flat Pack (MQFP), a Thin Quad Flat pack (TQFP), a Small Outline (SOIC), a Shrink Small Outline Package (SSOP), a Thin Small Outline (TSOP), a Thin Quad Flat pack (TQFP), a System In Package (SIP), a Multi Chip Package (MCP), a Wafer-level Fabricated Package (WFP), and a Wafer-Level Processed Stack Package (WSP) and so on.

Figure 8:
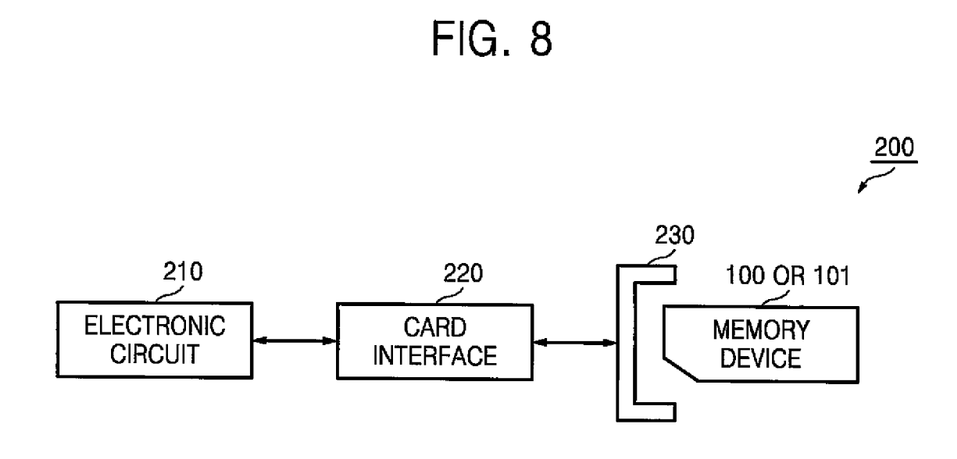
FIG. 8 is a block diagram of memory system including a memory device according to an embodiment of the inventive concept.
Figure 9:
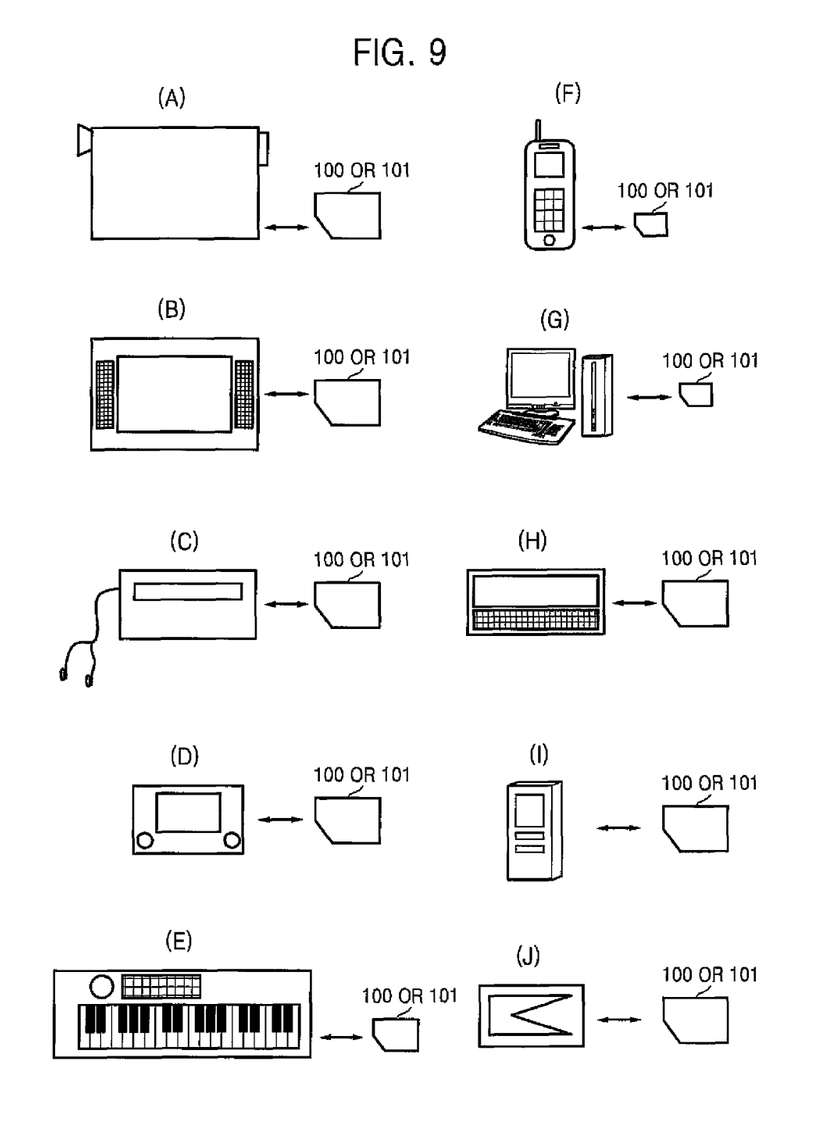
FIGS. 9A to 9J illustrate various embodiments of memory systems including one or more memory devices according to an embodiment of the inventive concept.

FIG. 8 is a block diagram illustrating a general example of a memory system including a memory device according to an embodiment of the inventive concept. FIGS. 9A through 9J show various possible embodiments of a memory system including a memory device according to embodiments of the inventive concept. Referring to FIGS. 8 and 9A to 9J, the memory devices 100 or 101 may be embodied as a memory card including, for example, a secure digital (SD) card or a Multi-media card (MMC). The memory card may also include a smart card.

The memory card 100 or 101 in which a memory device is used may be used in a video camera (FIG. 9A), a TV or an IPTV (FIG. 9B), a MP3 player (FIG. 9C), an electronic game console or a navigation (FIG. 9D), an electronic musical instrument (FIG. 9E), a mobile communication terminal such as a mobile phone (FIG. 9F), a personal computer PC (FIG. 9G), a personal digital assistant PDA (FIG. 9H), a voice recorder (FIG. 9I), or a PC card or a memory card reader (FIG. 9J), etc.

Accordingly, when the video camera (FIG. 9A), the TV or the IPTV (FIG. 9B), the MP3 player (FIG. 9C), the electronic game console or the navigation (FIG. 9D), the electronic musical instrument (FIG. 9E), the mobile communication terminal such as the mobile telephone (FIG. 9F), the personal computer PC (FIG. 9G), the personal digital assistant PDA (FIG. 9H), the voice recorder (FIG. 9I), or the PC card or the memory card reader(FIG. 9J) respectively has a card interface 220 and a slot 230 which may be connected to the card interface 220, the memory card 100 or 101, by being connected to the slot 230 electrically, may transmit or receive a predetermined data or a command with a CPU or a microprocessor(not shown) equipped in each electronic circuit 210 of the video camera (FIG. 9A), the TV or the IPTV (FIG. 9B), the MP3 player (FIG. 9C), the electronic game console or the navigation (FIG. 9D), the electronic musical instrument (FIG. 9E), the mobile communication terminal such as the mobile phone (FIG. 9F), the personal computer PC (FIG. 9G), the personal digital assistant PDA (FIG. 9H), the voice recorder (FIG. 9I), or the PC card or the memory card reader (FIG. 9J), etc. through the card interface 220. Moreover, the card interface 220 may be one of various interface protocols such as an USB, an MMC, a PCI-E, a SATA, a PATA, a SCSI, an ESDI, an IDE and so on.

In addition, although it is not illustrated in a drawing, a memory device according to the present inventive concept may be, for example, a non-volatile memory device, i.e., a flash memory device, which is capable of maintaining stored data even when an electric power is cut off. It may be used in mobile devices such as a cellular phone, a PDA digital camera, a portable game console and a MP3P, or home application such as a HDTV, a DVD, a router and a GPS. The memory device of the present inventive concept may be also used in a computer system, e.g., an application chipset, a Camera Image Processor (CIS), a mobile DRAM and a Solid State Drive/Disk (SSD).

The memory device according to embodiments of the inventive concept and the memory system including same may secure a contact area of other bit line and other page buffer unit, which are connected later, by locating a contact unit between a memory cell array and a page buffer unit, forming a sub-bit line in the contact unit, and connecting a bit line and a page buffer unit through the sub-bit line.

Although a few embodiments of the inventive concept have been shown and described, it will be appreciated by those skilled in the art that changes may be made in these embodiments without departing from the scope of the inventive concept which is defined in the appended claims and their equivalents.

What is claimed is:

1. A memory device comprising:
 a memory cell array comprising a memory cell connected to a bit line;
 a contact region into which the bit line extends horizontally and comprising a first portion of a sub-bit line which is vertically displaced relative to the bit line, wherein the bit line is connected to the sub-bit line via a first contact extending vertically between the bit line and the sub-bit line; and
 a page buffer region comprising a second portion of the sub-bit line connected to a second contact,
 wherein the contact region is located between the memory cell array and the page buffer region, wherein the first contact is formed in the contact region and the second contact is formed in the page buffer region, wherein the second contact has a greater width than the first contact.

2. The memory device of claim 1, wherein the bit line extends from the memory cell array to the contact region, and the sub-bit line extends from the contact region to the page buffer region.

3. The memory device of claim 1, wherein the bit line is aligned with the sub-bit line.

4. The memory device of claim 1, wherein a page buffer unit included in the page buffer region is connected to the sub-bit line via the second contact.

5. The memory device of claim 4, wherein the page buffer unit is one of a plurality of page buffer units included in the page buffer region, and the sub-bit line is one of a plurality of sub-bit lines.

6. A memory device comprising:
a memory cell array comprising a memory cell connected to a bit line;
a contact region comprising a first portion of a sub-bit line connected to the bit line via a first contact; and
a page buffer region comprising a second portion of the sub-bit line connected to a second contact,
wherein the contact region is located between the memory cell array and the page buffer region,
wherein the first contact is formed in the contact region and the second contact is formed in the page buffer region,
wherein the second contact has a greater width than the first contact, and
wherein the sub-bit line has a greater width than the bit line.

7. A memory device comprising:
a memory cell array comprising a memory cell connected to a bit line;
a contact region comprising a first portion of a sub-bit line connected to the bit line via a first contact; and
a page buffer region comprising a second portion of the sub-bit line connected to a second contact,
wherein the contact region is located between the memory cell array and the page buffer region,
wherein the first contact is formed in the contact region and the second contact is formed in the page buffer region,
wherein the second contact has a greater width than the first contact, and
wherein a region of a substrate below the contact region is devoid of a transistor.

8. A memory device comprising:
a memory cell array comprising a memory cell connected to a bit line;
a contact region comprising a first portion of a sub-bit line connected to the bit line via a first contact; and
a page buffer region comprising a second portion of the sub-bit line connected to a second contact,
wherein the contact region is located between the memory cell array and the page buffer region,
wherein the first contact is formed in the contact region and the second contact is formed in the page buffer region,
wherein the second contact has a greater width than the first contact, and
wherein a region of a substrate below the contact region is devoid of a gate structure.

9. A memory device comprising:
a memory cell array comprising a memory cell connected to a bit line;
a contact region comprising a first portion of a sub-bit line connected to the bit line via a first contact; and
a page buffer region comprising a second portion of the sub-bit line connected to a second contact,
wherein the contact region is located between the memory cell array and the page buffer region,
wherein the first contact is formed in the contact region and the second contact is formed in the page buffer region,
wherein the second contact has a greater width than the first contact, and
wherein the contact region is devoid of a gate structure.

10. A memory device comprising:
a memory cell array comprising a memory cell connected to a bit line;
a contact region comprising a first portion of a sub-bit line connected to the bit line via a first contact; and
a page buffer region comprising a second portion of the sub-bit line connected to a second contact,
wherein the contact region is located between the memory cell array and the page buffer region,
wherein the first contact is formed in the contact region and the second contact is formed in the page buffer region,
wherein the second contact has a greater width than the first contact,
wherein the sub-bit line has a greater width than the bit line,
wherein a region of a substrate below the contact region is devoid of a transistor.

11. The memory device of claim 10, wherein the region of the substrate below the contact region is devoid of a gate structure.

12. The memory device of claim 10, wherein contact region is devoid of a gate structure.

13. The memory device of claim 10, wherein the bit line is aligned with the sub-bit line.

14. A solid state drive (SSD) including a memory device, wherein the memory device comprises:
a memory cell array comprising a memory cell connected to a bit line;
a contact region into which the bit line extends horizontally and comprising a first portion of a sub-bit line which is vertically displaced relative to the bit line, wherein the bit line is connected to the sub-bit line bit line via a first contact extending vertically between the bit line and the sub-bit line; and
a page buffer region comprising a second portion of the sub-bit line connected to a second contact,
wherein the contact region is located between the memory cell array and the page buffer region,
wherein the first contact is formed in the contact region and the second contact is formed in the page buffer region,
wherein the second contact has a greater width than the first contact.

15. The SSD of claim 14, wherein the sub-bit line has a greater width than the bit line.

16. The SSD of claim 14, wherein a region of a substrate below the contact region is devoid of a gate structure.

17. The SSD of claim 14, wherein the contact region is devoid of a gate structure.

18. The SSD of claim 14, wherein the bit line is aligned with the sub-bit line.

* * * * *